United States Patent
Bernstein et al.

(10) Patent No.: US 7,652,947 B2
(45) Date of Patent: Jan. 26, 2010

(54) BACK-GATE DECODE PERSONALIZATION

(75) Inventors: Kerry Bernstein, Underhill, VT (US);
Wilfried Haensch, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 133 days.

(21) Appl. No.: 12/039,233

(22) Filed: Feb. 28, 2008

(65) Prior Publication Data

US 2009/0219778 A1    Sep. 3, 2009

(51) Int. Cl.
*G11C 8/00* (2006.01)

(52) U.S. Cl. ............... 365/230.06; 365/51; 365/189.08

(58) Field of Classification Search ........... 365/230.06, 365/189.08, 51, 177
See application file for complete search history.

(56) References Cited

U.S. PATENT DOCUMENTS

| | | | |
|---|---|---|---|
| 4,305,139 A | 12/1981 | Zbrozek | |
| 4,571,510 A | 2/1986 | Seki et al. | |
| 5,559,368 A | 9/1996 | Hu et al. | |
| 6,128,230 A | 10/2000 | Amanai | |
| 6,326,666 B1 | 12/2001 | Bernstein et al. | |
| 6,448,601 B1 * | 9/2002 | Forbes et al. | 257/302 |
| 6,462,585 B1 | 10/2002 | Bernstein et al. | |
| 6,747,305 B2 | 6/2004 | Forbes et al. | |
| 7,177,177 B2 | 2/2007 | Chuang et al. | |
| 7,200,030 B2 | 4/2007 | Yamaoka et al. | |

FOREIGN PATENT DOCUMENTS

JP    2000195276    7/2000

OTHER PUBLICATIONS

Fuse, et al., "0.5 V SOI CMOS Pass-Gate Logic," Digest of Technical Papers, IEEE International Solid-State Circuits Conference; vol. 39, Feb. 1996; pp. 88-89.

* cited by examiner

*Primary Examiner*—Son Dinh
(74) *Attorney, Agent, or Firm*—Scully, Scott, Murphy & Presser, P.C.; Vazken Alexanian

(57) ABSTRACT

A novel methodology for the construction and operation of logical circuits and gates that makes use of and contact to a fourth ($4^{th}$) terminal (substrates/bodies) of MOSFET devices is implemented by the present invention to realize a novel decode personalization. The novel construction and operation of the decode personalization provides for maintaining body-contacted MOSFET devices at a lower threshold voltage ($V_{Th}$) when actively on (to increase overdrive and performance), and at a higher relative threshold voltage when off (to reduce leakage power). Because the threshold potential of a transistor moves inversely to its body potential, the body of each device is tied to the inverse of the device's drain voltage to achieve such a desirable threshold potential modulation effect for improved device, circuit, gate, decode personalization and logical family operation.

19 Claims, 2 Drawing Sheets

120
BACK-GATE DECODE PERSONALIZATION

BACKGROUND OF THE INVENTION

The present invention relates to very large scale semiconductor integrated (VLSI) circuits and technology, and more particularly relates to an economical binary technique for arbitrary array line depth decoding using back-gate CMOS devices, e.g., NFET devices, arranged in a decode personalization circuit to replace conventional binary tree decodes normally included in word line depth decoding circuitry to save power and IC area when implemented in SRAM, DRAM, ROM, ROS and other memory storage devices.

The need for low-power VLSI circuitry for use in numerous electronic applications is ever-growing. To reduce power consumption, lower operating voltages ($V_{dd}$) and minimized device dimensions are the constant aim of IC designers. To lower the threshold voltage ($V_{Th}$) and the operational voltage for IC devices, silicon-on-oxide (SOI) MOSFETs with body contact or back-gates, bulk MOSFETs with isolated body, and like devices have been developed and are known. Fuse, et al., "0.5 V SOI CMOS Pass-Gate Logic," DIGEST OF TECHNICAL PAPERS, IEEE International Solid-State Circuits Conference; vol. 39, February 1996; pp. 88-89 is a good example.

SOI metal oxide field effect transistors (MOSFETs) can be fabricated into two distinct modes of operation: 1) fully depleted (FD), and 2) partially depleted (PD) channel region (i.e., body). In conventional fully-depleted SOI devices, the silicon film thickness is usually less than or equal to half the depletion width of the bulk device. The surface potentials at the front and back interfaces are strongly coupled to each other and capacitively coupled to the front-gate and substrate through the front-gate dielectric and the buried oxide, respectively. Therefore, the potential throughout the silicon film, and hence the charge, is determined by the bias conditions on both the front-gate and the substrate. By using the substrate as a back-gate, the device can be operated as a dual-gated device. A back-gate may or may not have a discrete gate plate, which is physically insulated from the conduction layer. Devices may be back-gated by merely contacting the device body.

Dynamic threshold metal oxide semiconductor (DTMOS) devices can be fabricated on silicon-on insulator (SOI) substrates as described, for example, in U.S. Pat. No. 5,559,368, to Hu, et al., issued Sep. 24, 1996, and incorporated by reference ("the '368 patent"). The '368 patent discloses a DTMOS device (MOSFET) fabricated on a silicon-on-insulator substrate to include a four-terminal layout comprising source, drain, gate and body contacts. The DTMOS device comprises a substrate with a buried oxide layer formed therein, and a P—SI film disposed on the oxide layer. N+ sources and drains are formed in the film. A gate electrode is formed on a gate insulation layer on the film between the source and drain of the MOSFET device. The gate and film are interconnected (gate to body) to reduce the turn-on voltage ($V_{Th}$) when the gate voltage is high, and elevate it when the gate voltage is low.

The reduced threshold or turn-on voltage ($V_{Th}$) improves MOSFET device performance in numerous respects. When the FET is OFF, the threshold voltage is increased, reducing sub-threshold leakage currents. Applications that use DTCMOS devices realize lower leakage currents while the MOSFET device is off, and higher drive currents when the device is on. In non-DTCMOS structures, the bulk silicon material from which the channel of the MOSFET device is formed is either grounded, or in many applications connected to the source region of the device.

U.S. Pat. No. 6,326,666, to Bernstein, et al., issued Dec. 4, 2001, and incorporated by reference (the '666 patent), discloses a DTCMOS circuit implemented in SOI that includes a plurality of input transistors with threshold voltages controlled by early arriving logic signals. The DTCMOS transistors have body contacts connected to the monocrystalline silicon film of the device. Use is made of the body contact for controlling the voltage threshold ($V_{Th}$) of a device that receives a respective logic signal. Earlier arriving logic signals are coupled to the gate of one input transistor, as well as to the body contact of another transistor receiving a later arriving logic signal. A data transition on the earlier arriving logic signal will lower the voltage threshold of the input transistor receiving the later arriving signal. Thus, a dynamic lowering of the voltage threshold occurs, permitting an increase in speed for the logic circuit.

U.S. Pat. No. 6,462,585, to Bernstein, et al., issued Oct. 8, 2002, and incorporated by reference ("the '585 patent"), discloses an asymmetric-double-gate complementary metal oxide semiconductor (DGCMOS) device that includes a cross-coupled latch circuit to improve effective $V_{dd}/V_{Th}$. The cross-coupled latch circuit substantially reduces body-to-source/drain parasitic capacitances as well as structural body resistance parasitics of the asymmetric-DGCMOS device and improves the effective $V_{dd}/V_{Th}$ ratio without causing any substantial body-to-source/drain parasitic capacitances or structural body resistance parasitics. DGCMOS devices are scalable below about 0.1 mm, while able to operate at voltages below about 1 V.

Back-gate devices are known to be used in semiconductor memory circuits and devices such as dynamic random access memory (DRAM), static random access memory (SRAM), video random access memory (VRAM), erasable programmable read only memory (EPROM), flash memory, etc. Memory devices, or cells, are generally located at intersections of word lines and bit lines (rows and columns of an array), where each cell conventionally stores a single bit of data as a logical "1" or a logical "0," which may thereafter be individually accessed, addressed or selected. Each cell is addressed using two multi-bit numbers in some kind of decoder. The first multi-bit number, or row address, identifies the row of the memory array in which the memory cell is located. The second multi-bit number, or column address, identifies the column of the memory array in which the desired memory cell is located.

Back-gate device operation in such memory storage devices and the address encoders/decoders operating with them complement known techniques for interrogating memory arrays comprising individual storage elements and devices. Back-gate memory cells may comprise, for example, a string of field effect transistor (FET) switches that form a series connection to ground from a signal line. By use of back gating, a discharge path from a signal line may be influenced by precharging the signal line.

Japanese Patent No. JP 2000195276 to Morishima, published Jul. 14, 2000, discloses a memory decode circuit or tree that includes a voltage-controlled array decode tree circuit 80. The array decode tree circuit 80 includes NFET devices with their bodies tied to their source terminal as found in the conventional arts. The NFET devices are not arranged in the Morishima array decode tree circuit 80 to utilize the body effect. The array decode tree circuit 80 receives column address decoded from column address signal Y, and generates and outputs control signals BBL1, BBL2, so that BBL1 and BBL2 can control the level of the signals applied to devices comprising the memory cells (M). The body-biased NFET devices are controlled to be at a −Vpp potential level when corresponding column selection signals are off. The signals have a corresponding ground state when active. Morishima, however, does not suggest the use of coupled back-gate operation, nor does it suggest or teach using body voltage modulation to personalize the decode.

What would be desirable, therefore, in the field of semiconductor memory circuits and their operation is a decode personalization and like circuit constructed with back-gate MOSFET devices. In coupled back-gate operation, these devices positively capture logic states, reduce leakage currents and improve noise immunity by dynamically modulating threshold voltages during normal device operation. Such decode personalization would be particularly effective in SRAM, DRAM, ROM, ROS and other memory storage circuits in realizing significant reductions in leakage current (power) and chip area required to perform decode personalization.

SUMMARY OF THE INVENTION

To that end, the present invention provides a novel binary tree decode personalization, constructed for arbitrary array word line depth decoding using coupled back-gate MOSFET circuitry for body voltage modulation. The novel decode circuitry readily implements back-gate decode personalization in a form of a 4-1 dynamic multiplexer using two address bits, using NOR-function logic, and NAND-function logic, using CMOS back-gate NFETS, and/or CMOS back-gate PFETs.

Broadly, the present invention provides a novel methodology for the construction and operation of logical circuits and gates that make use of its contact to a fourth ($4^{th}$) terminal (substrate/body) of the MOSFET devices. The novel construction and operation provides for maintaining such body-contacted MOSFET devices at a lower threshold voltage ($V_{Th}$) when actively on (to increase overdrive and performance), and at a higher relative threshold voltage when off (to reduce leakage power). Because the threshold potential of a transistor moves inversely to its body potential, it follows then that in general, the body of a given device must be tied to the inverse of the device's drain voltage to achieve such a desirable threshold potential modulation effect for improved device, circuit, gate and logical family operation. The present invention provides for such operation.

Circuits or gates constructed to use the fourth ($4^{th}$) terminal substrate/body contact of the MOSFET devices (NFET or PFET) comprising the circuits and gates may achieve an improved or higher circuit performance when on, and a lower circuit power when off. Such novel device circuitry, for example, in a decode personalization and its operation is readily distinguished from conventional operation wherein the body contact in MOSFET devices is used merely to invert the output, and the tying of such inverted output to the body. Such novel circuit construction in the decode personalization requires tying or connecting a logically evaluated output of a logical gate back to the body of selected transistors in decode personalization. Conceptually, the novel technique may be applied to any of the prevalent memory circuit technologies described.

DESCRIPTION OF THE DRAWINGS FIGURES

The foregoing and other objects, aspects and advantages will be better understood from the following detailed description of embodiments of the inventions, with reference to the drawings, in which.

DETAILED DESCRIPTION OF THE INVENTION

As mentioned above, the inventive back-gate decode personalization, and its novel operation as contemplated by the invention may be implemented in back-gate CMOS NFETs and/or PFETs, to replace binary tree decodes used in conventional word line decode schemes, and may be used in any memory storage technology and operation include SRAM, DRAM, ROM, ROS, etc., known to the skilled artisan. While the preferred embodiment of the invention is constructed, and described herein with CMOS NFET devices, the reader should note that the invention is described in detail with respect to the NFET implementation for exemplary purposes only, and that the preferred embodiments of the invention may be implemented with any known back-gate MOSFET devices, e.g., PFETs, without deviating from the scope and spirit of the invention. For that matter, the novel decode personalization may be implemented in any known back-gate device technology, by which it will operate in accordance with the novel operating characteristics set forth herein.

Figure 1:
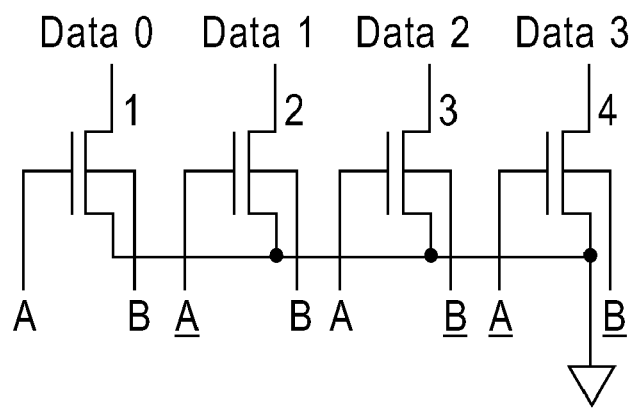
FIG. 1 is a schematic diagram of one embodiment of a novel back-gate personalization scheme decoder of the invention, which decodes using a NOR-style structure.

FIG. 1 herein is a schematic diagram of one embodiment of a novel back-gate personalization decode 100 of the invention, implemented in four back-gate CMOS NFET devices (1, 2, 3, 4) with NOR functionality. The sources of each of the NFET devices are tied together to ground. The drains of each of NFET devices are connected to respective data lines, Data 0, Data 1, Data 2 and Data 3. An addressing signal A is connected to the gates of NFET 1 and NFET 3, and an inverted version, or A', is connected to the gates of NFET 2 and NFET 4. An addressing signal B is connected to the back gate of NFET 1 and NFET 2, and an inverted version, or B', is connected to the back gate of NFET 3 and NFET 4.

Back-gate decode personalization circuit 100 implements a 4-1 dynamic multiplexer (mux) operation using address bits A and B. The novel decode personalization 100, and its decode operation that it supports is implemented through a binary connection of true and complement address signals attached to the back-gate of double-gated N-type MOSFETs. The voltage threshold ($V_{Th}$) for NFETs 1, 2, 3 4, must be set correctly to assure that only one selected personalization decode leg (of the four decode legs), preferably with a high back-gate voltage, that will stay on even if the NFET front gate is turned off.

If pre-charging is included in the novel operation, and if A & B are both low, then only Data 0 can remain un-discharged after the decode operation. Again with pre-charge, if A & B are both high, then only Data 3 will remain un-discharged after decoding is completed.

Figure 2:
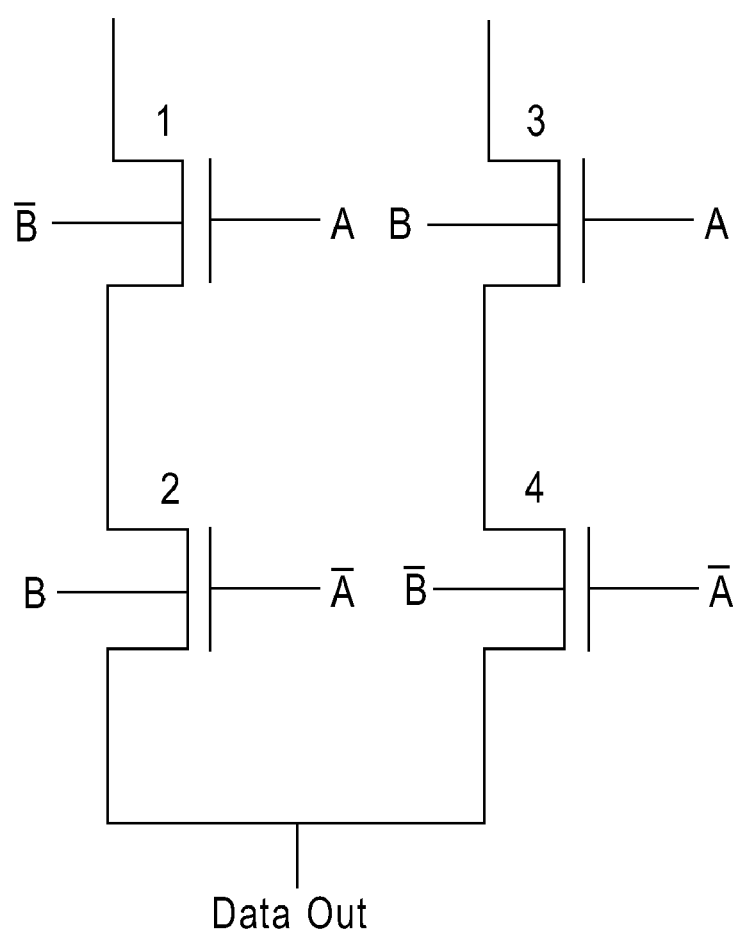
FIG. 2 is a schematic diagram of another embodiment of a novel back-gate personalization scheme decoder of the invention, which decodes using a NAND-style structure.

FIG. 2 is a schematic diagram of another embodiment of a novel back-gate decode personalization 200 of the invention. Decode personalization circuit 200 provides for decoding using NAND structures, and propagates static values rather than dynamic values. Novel back-gate decode personalization 200 is implemented in four back-gate CMOS NFETs (1, 2, 3, 4), as shown. The drains of back-gated NFET 1 and back-gated NFET 3 are connected to data lines Data 0 and Data 1 respectively. The sources of NFET 1 and NFET 3 are connected respectively to the drains of back-gated NFET 2 and back-gated NFET 4, the sources of which are connected together as a Data Out node or line. Address bit A is connected to the front gates of back gated NFET 1 and back-gated NFET 3, and an inverted version, or A', is connected to the front gates of back-gated NFET 2 and back-gated NFET 4. Address bit B is connected to the back gate of back-gated NFET 2 and back-gated NFET 3, where an inverted version, or B', is connected to the back gates of back-gated NFET 1 and back-gated NFET 4.

It should be understood that the novel decode personalization shown includes NFETs that are double-gated devices with personalized T and C lines, but as mentioned above, can be readily implemented using PFETs.

Figure 3:
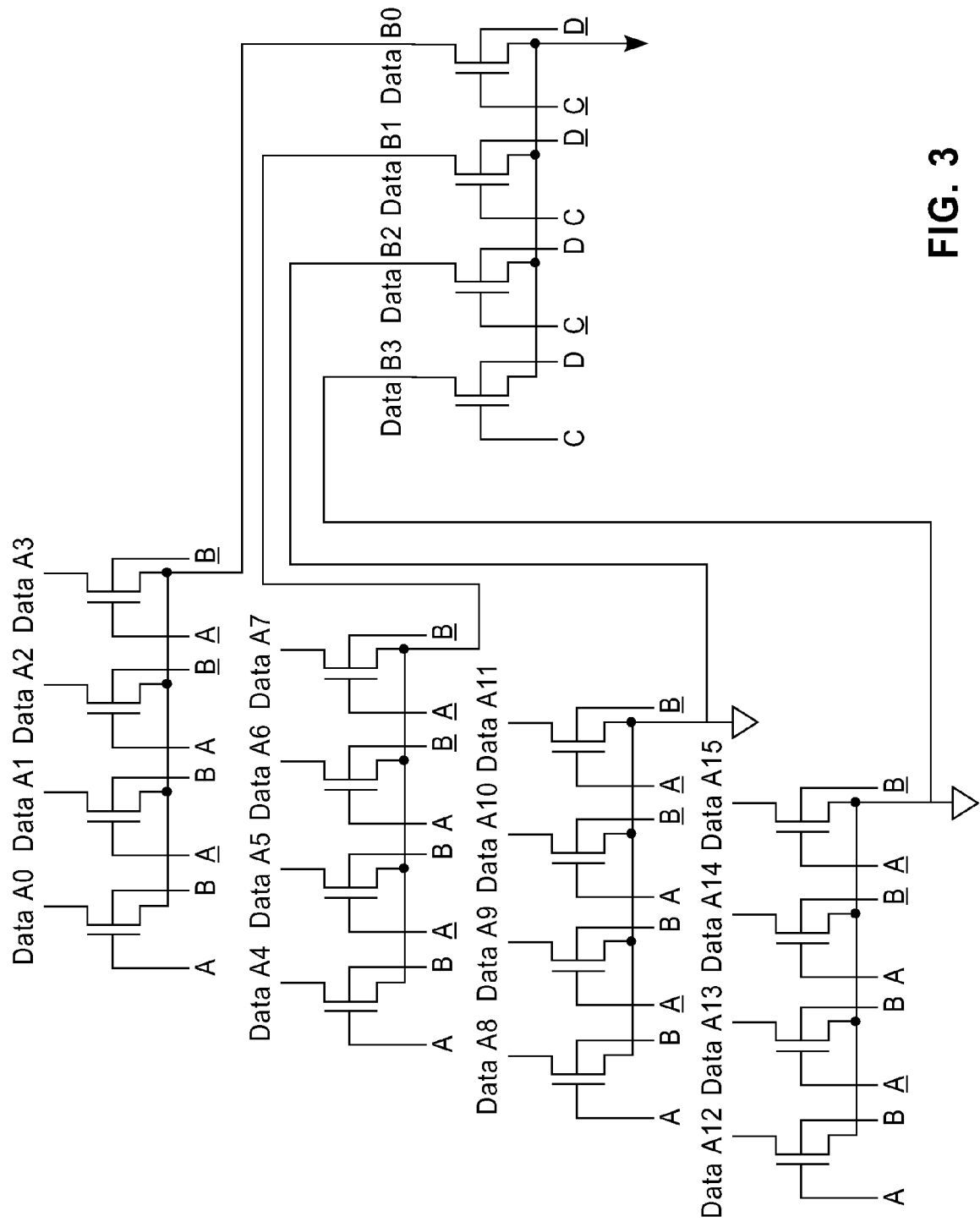
FIG. 3 is a schematic diagram of another embodiment of a novel back-gate personalization scheme decoder (16:1) of the invention, which decodes using a NOR-style structure.

FIG. 3 herein depicts a 16:1 decode personalization in which the circuit block of FIG. 1 is used in layers of decoding to decode 16 lines instead of fours line. In the FIG. 3 embodiment, there are two layers of decode, addressed by four (4) inputs, A, B, C and D, and their complements as shown in the figure. This NOR style structure may be readily extrapolated to a decode personalization that will decode 64, 256, 1024, etc, by adding additional layers of decoding, as was done in the FIG. 3 embodiment compared to FIG. 1. The four address line inputs select 16 data lines, A0, A1, A2, ..., A15, in the first input decode layer, which must further pass through the second decode layer. That is, the outputs of A03, A07, A011 and A015 are passed through the second layer devices as data lines B0, B1, B2 and B3, respectively.

Adding further layers to the decode personalization of FIG. 3 can realize a decode personalization that can select from 64 data lines, 256 data lines, 512 data lines, etc, respectively. That is, the same inventive principle, that the lines are selected only when each dynamically charged device is discharged where the gated device input, and the back-gate device input, are both held low, can be extended to select an arbitrary number of data lines needed for a particular application. The added decode layering to increase the number of decodable data lines also may be applied to the Nand style structure of FIG. 2, or by any other available NFET or pFET structure embodying the inventive principles.

More particularly, the invention, while described herein with respect to back-gate CMOS NFETs and PFETs, may be implemented using any type of back-gate device technology available, and known to the skilled artisan, wherein the lines are selected through the back-gate controlled devices only when each dynamically charged back-gate device is discharged under the conditions that the gated device input, and the back-gate device input, are both held low. And while it is apparent that the invention herein disclosed is well calculated to fulfill the objects stated above, it will be appreciated that numerous modifications and embodiments may be devised by those skilled in the art and it is intended that the appended claims cover all such modifications and embodiments as fall within the true spirit and scope of the present invention.

The invention claimed is:

1. A personalization decode for use in a semiconductor memory comprising a first circuit block connected, comprising a first decode layer, to four (4) data lines using two (2) address line inputs, the first circuit block comprising:
    first, second, third and fourth FET devices, where each FET device includes a source, a drain, a gate and a back gate, the drains of which are connected to one each of the four (4) data lines, and the source of each FET device is connected to ground for NOR-like decode functionality;
    wherein the gates of the first and third FET devices are connected to the first address line input, and the gates of the second and fourth FET devices are connected through an inverter to the first address line input;
    wherein the back gates of the first and second FET devices are connected to the second address line input, and the back gates of the third and fourth FET devices are connected through an inverter to the second address line input; and
    wherein address decode signals asserted through the first and second address line inputs during decode operation at the back gate of the FET devices bias the devices to lower the relative threshold voltage for "on" state operation, and to elevate the relative voltage threshold for "off" state operation.

2. The personalization decode as set forth in claim 1, wherein address decode signals asserted at the address line inputs during decode operation at the back gates of the FET devices bias the devices in an "on" state for lower thresholds with more overdrive and more current and biases devices in an "off" state for higher thresholds with less overdrive and less leakage current.

3. The personalization decode as set forth in claim 1, wherein the FET devices comprise NFET devices.

4. The personalization decode as set forth in claim 1, wherein the FET devices comprise PFET devices.

5. The personalization decode as set forth in claim 1, wherein the FET devices are fabricated in one of SOI, DTC-MOS and DGCMOS transistor device technology.

6. The personalization decode as set forth in claim 1, wherein the FET devices are fabricated by any known back-gate transistor device technology, or logical family and style, wherein such personalization decode is arranged such that the data lines are selected only when each dynamically charged back-gate device discharges only when its gated input, and its back-gated input are both held low in accordance with the state of the address line signals provided to select particular data lines.

7. The personalization decode as set forth in claim 1, further comprising a second circuit block in the first layer that is substantially an equivalent of the first circuit block, and which is connected to an additional four (4) data lines using two additional address line inputs, in order to decode two sets of four (4) data lines each, or $2^8$, the second circuit block comprising:
    fifth, sixth, seventh and eighth FET devices, where each FET device includes a source, a drain, a gate and a back gate, the drains of which are connected to one each of an additional four (4) data lines, and the source of each FET device is connected to ground for NOR-like decode functionality;
    wherein the gates of the fifth and seventh FET devices are connected to the third address line input, and the gates of the sixth and eighth FET devices are connected through an inverter to the third address line input; and
    wherein the back gates of the fifth and sixth FET devices are connected to the fourth address line input, and the back gates of the seventh and eighth FET devices are connected through an inverter to the fourth address line input.

8. The personalization decode as set forth in claim 7, further comprising a third circuit block, in the first layer, that is substantially an equivalent of the first circuit block, and which is connected to an additional four (4) data lines using two additional address line inputs, in order to decode three (3) sets of four (4) data lines each, or $2^{12}$.

9. The personalization decode as set forth in claim 1, further comprising a second layer of decode, the second layer of decode constructed so that the personalization decode may address an additional twelve (12) data lines, wherein the total of sixteen (16) data lines are selected using two additional address line inputs, in a 16:1 decode scheme, the personalization decode comprising:

second, third and fourth circuit blocks, added within the first layer, which circuit blocks are equivalent to the first circuit block, and which are connected to by said first and second data lines;

a fifth circuit block, which is equivalent to the first circuit block, wherein the fifth circuit block is arranged as a second layer and to include third and fourth address line inputs to the personalization decode, and wherein outputs of the first four circuit blocks are connected as data line inputs to realize 16:1 operation.

10. The personalization decode as set forth in claim 9, further comprising a third layer of decode, the third layer of decode constructed to address an additional sixteen (16) data lines, for a total addressability of thirty-two (32) data lines, in a 32:1 decode scheme.

11. The personalization decode as set forth in claim 9, further comprising at least N additional layers of decode, where N is a positive integer of at least 1, for a total of 2+N layers of decode, wherein each additional layer of the at least N additional layers is constructed to add an additional sixteen (16) data lines, for a total addressability of 16(1+N) data lines, in a 16(1+N):1 decode scheme.

12. A personalization decode for use in a semiconductor memory, comprising:
in a first decode layer, first, second, third and fourth FET devices, where each FET device includes a source, a drain, a gate and a back gate, where the drains of the first and third FET devices are connected to one of 2 data lines, respectively, the sources of which are connected to the drains of the second and fourth FET devices respectively, and the sources of the second and fourth FET devices are connected to a decode output for NAND-like decode functionality;

wherein the gates of the first and third FET devices are connected to a first address line, and the gates of the second and fourth FET devices are connected through an inverter to the first address line;

wherein the back gates of the second and third FET devices are connected to a second address line, and the back gates of the first and fourth FET devices are connected through an inverter to the second address line; and wherein address decode signals asserted through the first and second address lines during decode operation at the back gate of the FET devices bias the devices to lower the relative threshold voltage for "on" state operation, and to elevate the relative voltage threshold for "off" state operation.

13. The personalization decode as set forth in claim 12, wherein address decode signals asserted during decode operation at the back gates of the FET devices bias the devices in an "on" state for lower thresholds with more overdrive and more current and bias devices in an "off" state for higher thresholds with less overdrive and less leakage current.

14. The personalization decode as set forth in claim 12, wherein the FET devices comprise NFET devices.

15. The personalization decode as set forth in claim 12, wherein the FET devices are fabricated in one of SOI, DTCMOS and DGCMOS technology.

16. The personalization decode as set forth in claim 12, wherein the FET devices comprise PFET devices.

17. The personalization decode as set forth in claim 12, wherein the FET devices are fabricated by any known back-gate transistor device technology, or logical family and style, wherein such personalization decode is arranged such that the data lines are selected only when each dynamically charged back-gate device discharges only when its gated input, and its back-gated input are both held low in accordance with the state of the address line signals provided to access particular data lines.

18. The personalization decode as set forth in claim 12, further comprising, in a parallel arrangement, a second decode layer, equivalent to the first decode layer, where the additional two (2) address lines are arranged to represent a third and fourth address bit, so that the personalization decode decodes in a 16:1 arrangement.

19. The personalization decode as set forth in claim 12, further comprising, in a parallel arrangement, an additional N decode layers, each of the N additional decode layers equivalent to the first decode layer, where an additional two (2) address lines are arranged two additional address bits in each of the additional N layer, so that the personalization decode decodes in a $2^{2N}$:1 arrangement.

* * * * *